United States Patent [19]

Bouard et al.

[11] Patent Number: 5,503,657
[45] Date of Patent: Apr. 2, 1996

[54] PROCESS FOR THE SEPARATION OF A GASEOUS HYDRIDE OR A MIXTURE OF GASEOUS HYDRIDES WITH THE AID OF A MEMBRANE

[75] Inventors: Pascal Bouard, Draveil; Philippe Labrune, Saint Maur; Alain Villermet, Viroflay; Michel Gastiger, Orsay, all of France

[73] Assignee: L'Air Liquide, Societe Anonyme Pour L'Etude et L'Exploitation Des Procedes Georges Claude, Paris, France

[21] Appl. No.: 305,725

[22] Filed: Sep. 14, 1994

[30] Foreign Application Priority Data

Sep. 17, 1993 [FR] France .................................. 93 11083

[51] Int. Cl.$^6$ ................................................. B01D 53/22
[52] U.S. Cl. ........................... 95/45; 95/52; 95/53; 95/54; 95/55
[58] Field of Search ............................................ 95/45–55

[56] References Cited

U.S. PATENT DOCUMENTS

| | | | |
|---|---|---|---|
| Re. 30,351 | 7/1980 | Hoehn et al. | 95/55 X |
| 3,455,817 | 7/1969 | Modell | 95/45 X |
| 4,178,224 | 12/1979 | Porter | 204/237 |
| 4,424,067 | 1/1984 | Tarasenko et al. | 95/48 |
| 4,578,256 | 3/1986 | Nishino et al. | 95/133 X |
| 4,707,342 | 11/1987 | Iniotakis et al. | 95/55 X |
| 4,717,394 | 1/1988 | Hayes | 95/55 X |
| 4,861,939 | 8/1989 | Debras et al. | 95/133 X |
| 4,869,732 | 9/1989 | Kalfoglou | 95/46 |
| 4,925,459 | 5/1990 | Rojey et al. | 95/55 X |
| 4,941,893 | 7/1990 | Hsieh et al. | 55/16 |
| 4,957,513 | 9/1990 | St. Hilaire | 55/16 |
| 5,076,817 | 12/1991 | Hayes | 95/47 |
| 5,089,244 | 2/1992 | Parent et al. | 95/133 X |
| 5,226,932 | 7/1993 | Prasad | 95/45 |

FOREIGN PATENT DOCUMENTS 239190 9/1987 European Pat. Off. .

OTHER PUBLICATIONS

*Journal of Membrane Science*, "Separation of Hydrogen from Silane via Membranes: A Step in the Production of Ultra–High–Purity Silicon", Hsieh et al. pp. 143–152, 1992.
WPI Database of JP–A–60 022 902, Feb. 2, 1985.

Primary Examiner—Robert Spitzer
Attorney, Agent, or Firm—Burns, Doane, Swecker & Mathis

[57] ABSTRACT

The invention relates to a process for the separation of a gaseous hydride or a mixture of gaseous hydrides from a gaseous medium containing at least one gas from the group consisting of $H_2$, Ar, He, according to which the gaseous medium is passed on to a membrane module so that the concentration of the hydride or of the mixture of hydrides obtained at the outlet of the module is higher than their initial concentration in the gaseous medium.

19 Claims, 2 Drawing Sheets

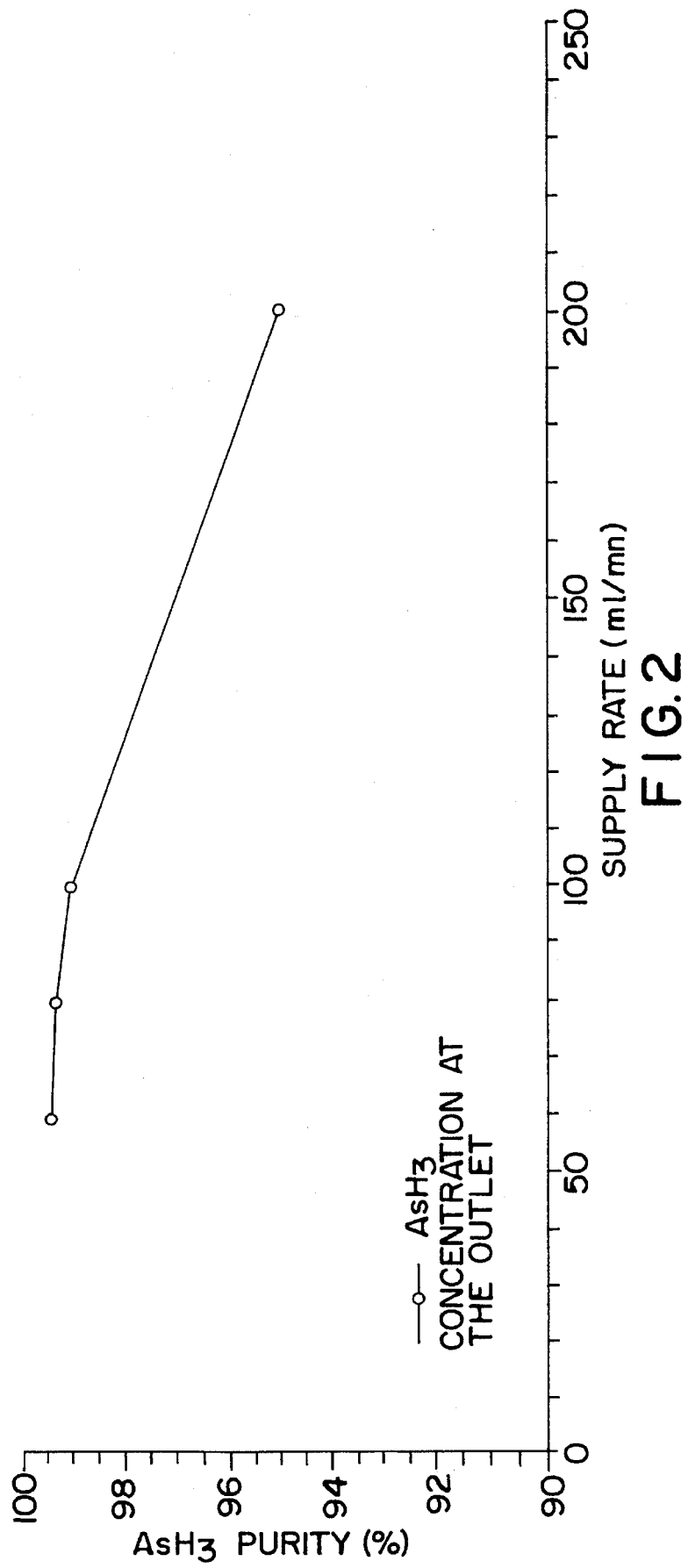

PROCESS FOR THE SEPARATION OF A GASEOUS HYDRIDE OR A MIXTURE OF GASEOUS HYDRIDES WITH THE AID OF A MEMBRANE

BACKGROUND OF THE INVENTION (i) Field of the invention

This invention relates to a process for the membrane separation of gases, and more particularly to the separation of gaseous hydrides or mixtures of gaseous hydrides, such as $SiH_4$, $Si_2H_6$, $AsH_3$, $PH_3$, or even $GeH_4$, frequently used in the microelectronics industry for operations such as the manufacture of metallic silicon, the deposition of silica $SiO_2$, or even the doping of predetermined zones of a semiconductor.

(ii) Description of Related Art

The use of atmospheres of this kind comprising gaseous hydrides traditionally poses problems associated with:

a) the strict safety conditions under which these atmospheres must be used. The majority of them exhibit high risks of toxicity, to which can be added risks associated with the flammable nature of some of them. In this context, it is often recommended to use them within a certain safety or concentration limit in a carrier gas (this limit varying from one hydride to another), the difficulty being that the applications mentioned hereinabove generally require higher concentrations than this safety limit, as they sometimes reach several tens of %, and b) their high cost, urging users to attempt as far as possible to recycle the hydride or the mixture of hydrides not having reacted in the course of the process in question using this hydride or these hydrides.

In such a context, the advantage of being able to separate hydrides of this kind will be clear, with aims such as:

the purification of the mixtures obtained at the outlet of generators for the production of gaseous hydride, which, in addition to the hydride desired, produces residual species, such as hydrogen, water vapour, etc. An example is an electrolytic arsine generator producing a mixture of arsine and hydrogen with a higher or lower arsine concentration at the cathode;

the treatment of the mixtures obtained at the outlet of reactors using hydrides or mixtures of hydrides of this kind: the separation of the hydrides not having reacted and the recycling of these hydrides back to the inlet of the reactor. An example in this area is that of reactors for the manufacture of metallic silicon from gaseous silane $SiH_4$, and the safety concentration of hydrides in a carrier gas: in order only to use and convey sources (usually bottles) of gaseous hydrides including a hydride concentration in a carrier gas (a neutral gas or even hydrogen) lower than the safety limit mentioned hereinabove (e.g. 2% silane), and only to concentrate the hydride or the mixture of hydrides just upstream of the point of use where a high hydride concentration is required.

The existing processes for the separation of gaseous hydrides from a gaseous medium are generally very costly and present real dangers from the point of view of handling, be it separation by adsorption or by cryogenic distillation.

Nevertheless, the recent studies of document U.S. Pat. No. 4,941,893 can be cited, proposing the separation of gaseous silicon compounds ($SiX_aH_b$, including silane) from hydrogen or halogenated acids (HX, X: Cl, Br, I, F) with the aid of a semi-permeable membrane, this document particularly recommending and illustrating the use of a sulphonated polysulphone/polysulphone composite membrane. The results obtained in the case of silane are such that, for an initial $H_2/SiH_4$ mixture with 48.8% silane, the silane concentration at the membrane outlet varies from approximately 52% to approximately 84% according to the throughput in question at the inlet of the membrane. The concentration at the outlet varies between approximately 1.5% and 25% in the case of a silane concentration at the inlet of 1%.

The document U.S. Pat. No. 4,957,513 can also be mentioned, illustrating the membrane separation of hydrogen selenide ($H_2Se$) from a gaseous mixture containing in addition to $H_2Se$, $H_2O$ and HCl, as obtained at the outlet of a hydrogen selenide generator. In view of the membranes used and the permeation properties of $H_2Se$ in these membranes, the mixture enriched with hydrogen selenide is obtained at the permeate side of the membrane.

SUMMARY OF THE INVENTION

The aim of this invention is to propose an improved process for the separation of hydrides or mixtures of hydrides, the performances of which make it possible to separate many different hydrides (or mixtures of hydrides), such as silane ($SiH_4$), disilane ($Si_2H_6$), phosphine ($PH_3$), arsine ($AsH_3$) or even germane ($GeH_4$), from a gaseous medium including at least one of the gases from the group consisting of $H_2$, He, Ar with high comparable and adjustable selectivity.

The feature of "adjustability" is particularly important from the point of view of being able to produce the desired hydride concentration by appropriate use of the parameters of the process and to be able to vary this concentration as required in a simple manner.

The invention therefore proposes a process for the separation of a gaseous hydride or a mixture of gaseous hydrides from a gaseous medium containing at least one gas from the group consisting of $H_2$, Ar, He, characterised in that the gaseous medium is passed into a membrane module so that the concentration of the hydride or of the mixture of hydrides obtained at the outlet of the module is higher than their initial concentration in the gaseous medium, the separation of silane from hydrogen being excluded.

BRIEF DESCRIPTION OF THE DRAWINGS

FIG. 2 shows the course of the arsine purity of the mixture obtained at the membrane module outlet as a function of the supply rate of the membrane in an installation as shown in FIG. 1.

DETAILED DESCRIPTION OF PREFERRED EMBODIMENTS

Figure 1:
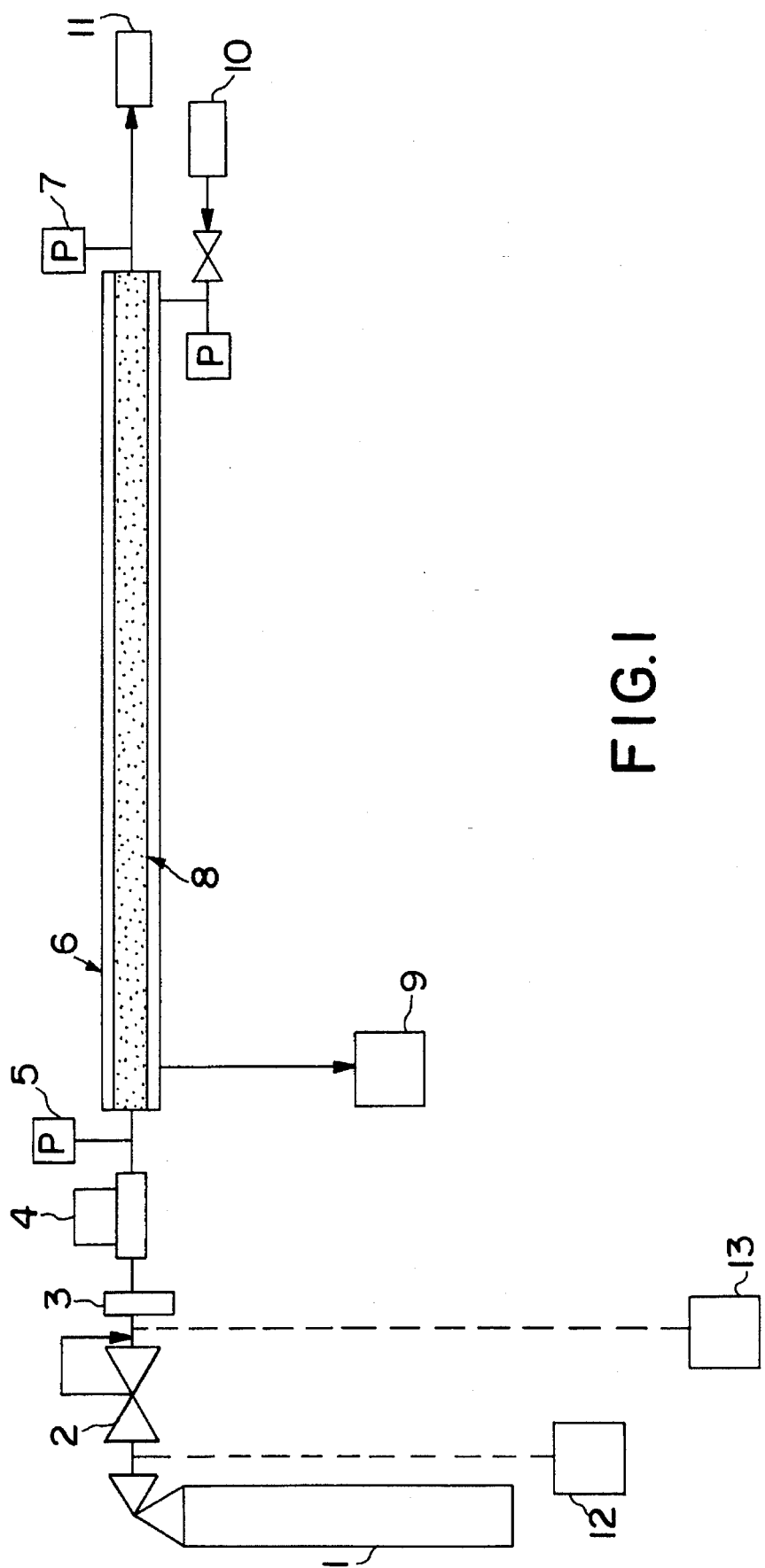
FIG. 1 is a diagrammatic view of an installation used for carrying out the process according to the invention.

The phrase "gaseous hydride" as used according to the invention refers to gaseous compounds such as silane, disilane, phosphine, arsine or even germane.

The phrase "membrane module" as used according to the invention refers to an assembly of one or more semipermeable membranes mounted in series or in parallel and having good properties for separating hydrides or mixtures of hydrides with respect to a carrier gas (selectivity), as is the case for membranes of the polyimide or even of the polyaramide (aromatic polyimide) type. This assembly of membranes can include membranes with different properties.

The gaseous medium treated in this manner by means of the membrane module can originate from very different sources, both with respect to the composition of the medium and with respect to its pressure and throughput properties, e.g.:

- a gaseous mixture originating from a gaseous hydride generator, comprising in addition to the gaseous hydride, residual "impurities" such as hydrogen, oxygen and water vapour. An example is an electrolytic arsine generator producing a hydrogen/arsine mixture with a higher or lower arsine concentration at the cathode;
- a gaseous mixture in fact forming a reaction mixture obtained at the outlet of reactor using the said gaseous hydride or hydrides, this reaction medium containing a proportion of the said gaseous hydride or hydrides not having reacted. The application of the process according to the invention to this type of mixture allows the mixture obtained at the outlet of the membrane module to be recycled back to the inlet of the reactor. An example is a deposition reactor (e.g. a reactor for the manufacture of metallic silicon) from a gaseous precursor of silicon, such as silane. The application of the process according to the invention to this type of reactor allows the silane not having reacted during the course of the process for the manufacture of silicon, taking place in this reactor, to be recycled back to the inlet of the reactor, or
- a gaseous mixture originating from a gaseous storage container of the bottle type, comprising a low concentration of gaseous hydride or of a mixture of gaseous hydrides in a carrier gas selected from the group consisting of $H_2$, Ar, He, this concentration being compatible with the safety limits for the concentration of these hydrides in the said carrier gas. The mixture obtained at the outlet of the membrane module by applying the process according to the invention to this type of gaseous mixture is then advanced to a point of use where the concentration required for the said gaseous hydride or mixture of gaseous hydrides is higher than that of the "safety" storage container.

According to one feature of the invention, the gaseous medium to be treated by means of the membrane module arrives at this membrane module under low pressure, compensated for in that the partial pressure of the gas it is desired to separate from the gaseous hydride or from the mixture of gaseous hydrides is reduced at the permeate side of the membrane. The phrase "low pressure" as used according to the invention refers to a pressure situated within the range $10^4$ Pa absolute to $5 \times 10^5$ Pa absolute. This "low pressure" feature of the invention is particularly advantageous for treating gaseous mixtures originating from certain hydride generators, or even from certain reactors using hydrides.

According to one of the embodiments of the invention, the partial pressure of the gas it is desired to separate from the gaseous hydride or from the mixture of gaseous hydrides is reduced at the permeate side of the membrane by pumping out the permeate side of the membrane. This results in a pressure of approximately 1 to 100 Pa (first stage vacuum) at the permeate side of the membrane.

According to another embodiment of the invention, the partial pressure of the gas it is desired to separate from the gaseous hydride or from the mixture of gaseous hydrides is reduced at the permeate side of the membrane by sweeping the permeate side of the membrane with the aid of a gas which is different from the one it is desired to separate and which moreover exhibits slight permeation of the permeate towards the interior of the membrane so as to prevent this "tool" gas from polluting the interior of the membrane and thus affecting the result obtained at the membrane outlet. According to the invention, nitrogen or even $SF_6$ is advantageously used as the "tool" gas.

According to another feature of the invention, the gaseous medium to be treated by means of the membrane module arrives at this module under pressure, and, depending on the gas sources, this pressure can reach $300 \times 10^5$ Pa and more (in the case of gases stored in bottles). This experimental condition can be expressed in terms of the pressure difference between the inlet and the permeate side of the membrane. According to the invention, this pressure difference is advantageously on within the range of $100 \times 10^5$ Pa absolute, and preferably within the range of $10^5$ Pa to $20 \times 10^5$ Pa absolute.

It will be noted that for certain pressure values on the borderline between the two categories "low pressure" and "pressurised" (such as $3 \times 10^5$ Pa), it is sometimes possible to avoid the use of a method of reducing the partial pressure at the permeate side (such as pumping out), but the results obtained by using a method of this kind could only be improved upon.

Other features and advantages of this invention will be clear from the following description of embodiments given purely by way of non-limiting examples and with reference to the accompanying drawings, in which:

In the embodiment shown in FIG. 1, a bottle 1 containing an arsine/hydrogen mixture with 15% arsine at $20 \times 10^5$ Pa forms the gaseous medium to be treated. This mixture is first relieved of pressure by means of a pressure-reducing valve 2 until a pressure of approximately 1 to $2 \times 10^5$ Pa is reached. It then passes on to a particle filter 3, and then into a flow meter 4 before arriving at a membrane module 6. A manometer 5 is interposed between the flow meter and the membrane module in order to obtain a measurement of the pressure of the gas before it arrives at the module.

Two alternative supply lines are shown by the dotted lines, for cases where the medium to be treated does not originate from a bottle, but originates from a reactor using a hydride or a mixture of hydrides, or even from a hydride generator. Depending on the pressure of the gaseous medium originating from devices of this kind (reactor or generator), the device is connected to the installation upstream of the pressure-reducing valve 2 (in the case of the device 12) or between the pressure-reducing valve 2 and the filter 3 (in the case of the device 13).

The membrane module 6 is advantageously of the hollow fibre membrane type, the active layer of which is a polyaramide (aromatic polyimide) and the properties of which allow a total exchange surface area for the module of approximately 0.25 $m^2$ to be obtained.

A pressure sensor 7 for evaluating the pressure of the discharge enriched with hydride is interposed downstream of the module 6. The discharge enriched with hydride is advanced to an analyser 11 to evaluate the arsine concentration of the discharge.

With respect to the permeate 8, the installation allows for pumping out with the aid of a vacuum pump 9. It is also possible to effect sweeping of the permeate side 8 of the membrane with the aid of a tool gas 10, in this case an $SF_6$ reserve.

According to a first example of the invention, an installation as shown in FIG. 1 is used to simulate an electrolytic arsine generator producing at the cathode an arsine/hydrogen mixture containing 15% arsine at a reduced pressure of 1 to $2\times10^5$ Pa absolute and with a very low throughput.

The application of the process according to the invention to a mixture of this kind with the aid of this installation at a temperature of approximately 20° C., pumping out the permeate side of the membrane to a pressure of approximately 10 Pa absolute, gives the results shown in FIG. 2.

It will be noted in this figure that for supply rates of the membrane module varying within the range [50; 100 ml/mn], the arsine is concentrated in the outgoing mixture of the membrane module at a level of approximately 99 to 99.5% arsine in hydrogen.

This result provides a solution not only to the problem of an arsine generator producing a mixture with insufficient arsine concentration, but also to the problem of the safety arsine concentration (with respect to flammability) from a bottle with a low concentration.

The course shown in FIG. 2 shows that when the supply rate of the module is increased, the arsine purity of the mixture at the membrane module outlet is reduced, although it is nevertheless maintained at approximately 95% arsine in hydrogen for a supply rate of 200 ml/mn (12 l/h).

Comparable results have been obtained using sweeping of the permeate with the aid of $SF_6$ instead of pumping out of the permeate side of the module, at a throughput varying within the range [50; 200 cm³/mn].

Excellent reproducibility of the results over several months has illustrated the good chemical inertia of the membrane used with respect to arsine.

Four examples of the invention will now be illustrated, according to which an initial silane source is treated, consisting of a bottle containing a silane/helium mixture with 2% silane using an installation comparable to the one shown in FIG. 1. In each case, the influence of parameters such as the supply pressure of the membrane module, the temperature of the module, the discharge throughput, or even the type of membrane used have been studied. For these four examples, the permeate side is not pumped out, nor is the permeate swept with the aid of a "tool" gas.

For all of these examples, the excellent reproducibility of the results over several months has illustrated the good chemical inertia of the membranes used with respect to the hydrides tested, and the fact that the few ppm of residual oxygen present in the atmospheres treated do not alter the operation of the membrane (possible formation of particles).
Second example The membrane module used is of the hollow fibre membrane type, the active layer of which is a polyimide, the properties of which are close to those of Example 1, in this case using a total exchange surface area for the module of approximately 0.2 m².

The temperature of the module was maintained at 30° C.

For this second embodiment, for a throughput at the module outlet (discharge) fixed at 0.17 l/mn, the influence of the supply pressure of the module on the silane concentration at the membrane module outlet was studied. A supply pressure varying from $3\times10^5$ Pa to $7\times10^5$ Pa absolute (supply rate varying between 3 l/mn and 10 l/mn) therefore resulted at the module outlet in:

a silane concentration in helium varying from 22% to 78%, and the corresponding pressure at the outlet varying from atmospheric pressure to approximately $3\times10^5$ Pa absolute.

For a supply pressure above $7\times10^5$ Pa absolute, the silane concentration in helium obtained would be greater than 78% and it would be less than 22% for a supply pressure of lower than $3\times10^5$ Pa absolute. In this latter case, it would be particularly desirable to reduce the partial pressure of the helium at the permeate side of the membrane with the aid of sweeping using a "tool" gas or even by pumping out as illustrated in Example 1.

Similarly, by reducing the discharge throughput, it is possible to increase the silane concentration at the module outlet above 90%. E.g. for a supply pressure of $7\times10^5$ Pa absolute and a discharge throughput of 0.07 l/mn (discharge pressure of $3.3\times10^5$ Pa absolute), a result of 94% silane in helium was obtained at the module outlet.
Third example:

This third example uses a membrane module of the same type and having the same properties as that of Example No. 2. Here once again, the temperature of the module is maintained at 30° C.

Here once again, for a throughput at the module outlet (discharge) fixed this time at 0.33 l/mn, the influence of the supply pressure of the module on the silane concentration at the module outlet was studied. Therefore, for a supply rate varying from $3\times10^5$ Pa to $7\times10^5$ Pa absolute (supply rate varying between approximately 3 l/mn and 10 l/mn), a silane concentration in helium varying from 11% to 51% is obtained at the module outlet. The pressure of the discharge in this case varied within the range [atmospheric pressure—$2.5\times10^5$ Pa] absolute.
Fourth example:

This fourth example uses a membrane module of the same type and having the same properties as that of Example No. 1. The temperature of the module is maintained at 30° C.

For this module, which is of a different type from that used for Example Nos. 2 and 3, and for a throughput at the module outlet (discharge) fixed this time at 0.28 l/mn, it is possible, by varying the supply pressure of the module from $4\times10^5$ Pa to $11\times10^5$ Pa absolute (supply rate varying between approximately 1.5 l/mn and 6.5 l/mn), to obtain at the module outlet a silane concentration in helium varying from 8 to 41%, under a pressure varying from $1.5\times10^5$ Pa to $8.2\times10^5$ Pa absolute.

An increase in pressure therefore leads to a clear increase in the selectivity of the membrane.

Here once again, reducing the discharge throughput (e.g. 0.07 l/mn, under a discharge pressure of $10.2\times10^5$ Pa absolute) with a supply pressure of $11\times10^5$ Pa absolute resulted in 92% silane in helium at the module outlet.
Fifth example:

This fifth example uses a module of the same type and having the same properties as that of Example No. 1. The aim in this case, for a discharge throughput at the module outlet fixed at 0.42 l/mn and for a supply pressure fixed at $11\times10^5$ Pa absolute, is to study the influence of the temperature of the module on the silane concentration obtained at the module outlet. The results obtained show that for a temperature varying from 18° C. to 50° C., the silane concentration in helium at the module outlet was situated between 23% and 40% under a discharge pressure varying from $8.8\times10^5$ Pa absolute (for 18° C.) to $7\times10^5$ Pa absolute (for 50° C.).

An increase in the temperature therefore leads to an increase in the selectivity of the membrane.

The last four examples illustrated therefore show to what extent it is possible to change the silane concentration obtained at the module outlet in a significant and flexible manner, by acting on parameters such as temperature of the module, supply pressure of the module and discharge throughput.

They provide an advantageous solution to the problem of the silane concentration for subsequent user stations requiring a silane concentration in helium of several tens of %, starting from a safety storage container containing only 2% silane.

Acting on the permeate makes it possible to treat cases where the gaseous supply medium arrives under low pressure.

We claim:

1. Process for separating a gaseous hydride or a mixture of gaseous hydrides from a gaseous medium comprising introducing a first gaseous medium, said first gaseous medium comprising (1) a gaseous hydride or a mixture of gaseous hydrides and (2) $H_2$, Ar and/or He, into a membrane module; separating at least a portion of said hydride or said mixture of hydrides from said first gaseous medium in said membrane module to form a second gaseous medium having a hydride concentration which is higher than the initial hydride concentration in the first gaseous medium; removing said second gaseous medium from said membrane module; and removing remaining gas from said membrane module, said process excluding separation of silane from hydrogen gas alone.

2. Process according to claim 1 wherein the hydride or the mixture of hydrides is silane, disilane, phosphine, arsine or germane.

3. Process according to claim 1 wherein the first gaseous medium is introduced into the membrane module under pressure such that there is a difference in pressure between an inlet side and a permeate side of the membrane not exceeding $100 \times 10^5$ Pa absolute.

4. Process according to claim 3 wherein the difference in pressure between the inlet side and the permeate side of the membrane is from $10^5$ Pa to $20 \times 10^5$ Pa absolute.

5. Process according to claim 1 wherein the first gaseous medium is introduced into the membrane module under low pressure.

6. Process according to claim 5 further comprising reducing pressure on the second gaseous medium being separated from said first gaseous medium at a permeate side of the membrane.

7. Process according to claim 6 further comprising reducing the pressure of the second gaseous medium at the permeate side of the membrane using one of the following methods:

pumping out the permeate side of the membrane, or sweeping the permeate side of the membrane with the aid of a gas exhibiting slight permeation towards an interior of the membrane.

8. Process according to claim 7 wherein said reducing is accomplished by said sweeping and the gas used to effect the sweeping is nitrogen.

9. Process according to claim 7 wherein said reducing is accomplished by said sweeping and the gas used to effect the sweeping is $SF_6$.

10. Process according to claim 5 wherein the pressure of the first gaseous medium introduced into the membrane module is from $10^4$ Pa to $5 \times 10^5$ Pa absolute.

11. Process according to claim 1 wherein the first gaseous medium originates from a generator for the production of gaseous hydrides.

12. Process according to claim 11 wherein the gaseous hydride generator is an electrolytic arsine generator producing a gaseous medium including a mixture of arsine and hydrogen at a cathode.

13. Process according to claim 1 wherein the first gaseous medium comprises a reaction mixture obtained at an outlet of a reactor using the gaseous hydride or hydrides, the reaction mixture containing a proportion of the gaseous hydride or hydrides not having reacted, said process further comprising recycling the second gaseous medium removed from the membrane module to an inlet of the reactor.

14. Process according to claim 13 wherein the reactor is a deposition reactor, using a gaseous precursor of silicon.

15. Process according to claim 1 further comprising the steps of a) originating the first gaseous medium treated by means of the membrane module from a bottle-type gaseous storage container, said container comprising a low concentration of the gaseous hydride or mixture of gaseous hydrides in a carrier gas including $H_2$, Ar, or He, said low concentration being compatible with safety limits for the concentration of these hydrides in said carrier gas, and b) advancing the second gaseous medium obtained at an outlet of the membrane module to a point of use where the concentration required for said gaseous hydride or mixture of gaseous hydrides is higher than the concentration of hydrides in the storage container of step a).

16. Process according to claim 1 wherein the membrane module uses several membranes with different properties.

17. Process according to claim 1 wherein the membrane module includes at least one polyimide or polyaramide membrane.

18. Process for separating a gaseous silane or a mixture of gaseous silanes from a gaseous medium comprising introducing a first gaseous medium, said first gaseous medium comprising (1) a gaseous silane or a mixture of gaseous silanes and (2) Ar and/or He, into a membrane module; separating at least a portion of said silane or said mixture of silanes from said first gaseous medium in said membrane module to form a second gaseous medium having a silane concentration which is higher than the initial silane concentration in the first gaseous medium; removing said second gaseous medium from said membrane module; and removing remaining gas from said membrane module.

19. Process for separating a gaseous hydride or a mixture of gaseous hydrides from a gaseous medium comprising introducing a first gaseous medium, said first gaseous medium comprising (1) a gaseous hydride or mixture of gaseous hydrides, said hydride or hydrides excluding silane and (2) $H_2$, Ar and/or He, into a membrane module; separating at least a portion of said hydride or said mixture of hydrides from said first gaseous medium in said membrane module to form a second gaseous medium having a hydride concentration which is higher than the initial hydride concentration in the first gaseous medium; removing said second gaseous medium from said membrane module; and removing remaining gas from said membrane module.

\* \* \* \* \*